United States Patent
Nagaseki et al.

(10) Patent No.: US 7,344,652 B2
(45) Date of Patent: Mar. 18, 2008

(54) PLASMA ETCHING METHOD

(75) Inventors: Kazuya Nagaseki, Nirasaki (JP);
Takanori Mimura, Nirasaki (JP);
Hiroki Miyajima, Nagaokakyo (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 11/487,516

(22) Filed: Jul. 17, 2006

(65) Prior Publication Data

US 2006/0255447 A1 Nov. 16, 2006

Related U.S. Application Data

(63) Continuation of application No. 10/497,534, filed as application No. PCT/JP02/12867 on Dec. 9, 2002, now Pat. No. 7,141,178.

(30) Foreign Application Priority Data

Dec. 11, 2001 (JP) .............................. 2001-377835

(51) Int. Cl.
*H01L 21/00* (2006.01)
*B44C 1/22* (2006.01)

(52) U.S. Cl. ............................ 216/67; 216/41; 216/46; 216/79; 216/99; 438/706; 438/710; 438/719

(58) Field of Classification Search ................ 216/41, 216/46, 67, 79, 99; 438/710, 719
See application file for complete search history.

(56) References Cited

U.S. PATENT DOCUMENTS

| 5,569,355 | A | 10/1996 | Then et al. |
| 6,051,866 | A | 4/2000 | Shaw et al. |
| 6,089,183 | A | 7/2000 | Imai et al. |
| 6,235,643 | B1 | 5/2001 | Mui et al. |

FOREIGN PATENT DOCUMENTS

| JP | 10-294367 | 11/1998 |
| JP | 2000-294626 | 10/2000 |

*Primary Examiner*—Shamim Ahmed
(74) *Attorney, Agent, or Firm*—Oblon, Spivak, McClelland, Maier & Neustadt, P.C.

(57) ABSTRACT

An etching method for forming a recess (220) having an opening dimension (R) of millimeter order in an object (212) to be etched such as a semiconductor wafer. A mask (214) having an opening corresponding to the recess (220) is formed on the object (212). The object (212) with the mask (214) is placed in a processing vessel for plasma etching and etched in it using a plasma. The material of the portion around the opening of the mask (214) is the same as the material, for example, silicon of the object (212). Hence, the recess (220) can be so formed as not to form a sub-trench shape (a shape formed by etching the periphery of which is deeper than the center) substantially in the bottom (222).

20 Claims, 8 Drawing Sheets

PLASMA ETCHING METHOD

CROSS-REFERENCE TO RELATED APPLICATIONS

This document is a Continuation Application of and is based upon and claims the benefit of priority under 35 U.S.C. § 120 U.S. Ser. No. 10/497,534 from U.S. Pat. No. 7,141,178, filed Jun. 10, 2004, which is a National Stage Application of International Application No. PCT/JP02/12867, filed Dec. 9, 2002. The present document also incorporates by reference the entire contents of Japanese priority document, 2001-377835 filed in Japan on Dec. 11, 2001.

FIELD OF THE INVENTION

The present invention relates to a method for etching an object to be etched, e.g., a semiconductor wafer, through a mask by using a plasma.

BACKGROUND OF THE INVENTION

Conventionally employed as an etching method is a plasma etching for etching an object to be etched by using a plasma. Employed in such a plasma etching method is, for example, an etching apparatus including a lower electrode and an upper electrode disposed opposite to face each other within a hermetically sealed processing vessel. In the etching apparatus, an object to be etched having a mask formed on a surface thereof is mounted on the lower electrode and a processing gas is supplied into the processing vessel. Thereafter, a high frequency power is applied to the lower electrode to excite the plasma, thereby executing the plasma etching.

The plasma etching method is widely employed to form a predetermined pattern on a surface of an object to be etched such as a semiconductor wafer and a liquid crystal substrate. The pattern thus formed has a size of the order of micron, in general.

Recent diversification in technical field will make it almost surely a necessity to form a recess with an opening dimension of the order of millimeter in the course of, for instance, microfabricating a jig for the formation of an integrated circuit.

FIG. 9 provides a schematic cross sectional view of an object to be processed 10 having a recess with an opening dimension of the order of millimeter which is formed by the conventional etching method. The object to be processed 10 shown in FIG. 9 is obtained by way of etching a semiconductor wafer 12 to be etched in accordance with the conventional etching method by using a desired pattern previously formed on a photoresist 14 provided on the semiconductor wafer 12 as a mask. A recess 20 thus formed in the wafer 12 is of a substantially cylindrical shape and its opening dimension (diameter) R ranges, for example, from 10 to 30 mm.

When the recess 20 with the opening dimension of the order of millimeter is formed by the conventional etching method as described above, a peripheral portion 24 of a bottom surface of the recess 20 may happen to be etched deeper than a central portion 22 thereof (hereinafter referred to as a "subtrench shape"). However, in most applications, it is preferable that the bottom surface of the recess is flat. In fact, the subtrench shape of the recess impedes a precision fabrication of various devices.

SUMMARY OF THE INVENTION

It is, therefore, an object of the present invention to provide an etching method capable of forming a recess with an opening dimension of the order of millimeter without generating a subtrench shape on a bottom surface thereof.

In accordance with the present invention, there is provided an etching method for forming a recess on a surface of an object to be etched, including the step of forming the recess by plasma etching through an opening of a mask formed on the surface of the object to be etched, wherein at least a portion of the object to be etched where the recess is to be formed and at least a portion of the mask around the opening are all made of silicon.

In accordance with the present invention there is further provided an etching method for forming a recess on a surface of an object to be etched, including the step of forming the recess by plasma etching through an opening of a mask formed on the surface of the object to be etched, wherein the opening includes a main opening portion corresponding to the recess to be formed and a slit-shaped subsidiary opening portion surrounding the main opening portion.

In accordance with these etching methods, a recess with an opening dimension of the order of millimeter can be obtained without a subtrench shape formed at a bottom surface thereof.

In accordance with the present invention, there is further provided an etching method for forming a recess on a surface of an object to be etched, including the step of forming the recess by plasma etching through an opening of a mask formed on the surface of the object to be etched, the opening having an opening dimension not smaller than 5 mm, wherein at least a portion of the object to be etched where the recess is to be formed and at least a portion of the mask around the opening are all made of a same material.

In accordance with the present invention, there is further provided an etching method for forming a recess on a surface of an object to be etched, including the step of forming the recess by plasma etching through an opening of a mask formed on the surface of the object to be etched, the opening having an opening dimension not smaller than 5 mm, wherein the plasma etching is performed in a processing vessel at a pressure not greater than 100 mTorr.

In accordance with these etching methods, a recess with an opening dimension greater than 5 mm can be obtained without a subtrench shape formed on a bottom surface thereof.

The opening dimension refers to a length of a shorter side in case the opening (opening edge portion of the recess) is of a substantially rectangular shape; a diameter in case of a circular shape; a shorter diameter in case of an elliptic shape; and a width in case of a groove shape (this is same in a description as will be described later).

DETAILED DESCRIPTION OF THE PREFERRED EMBODIMENTS

Figure 1:
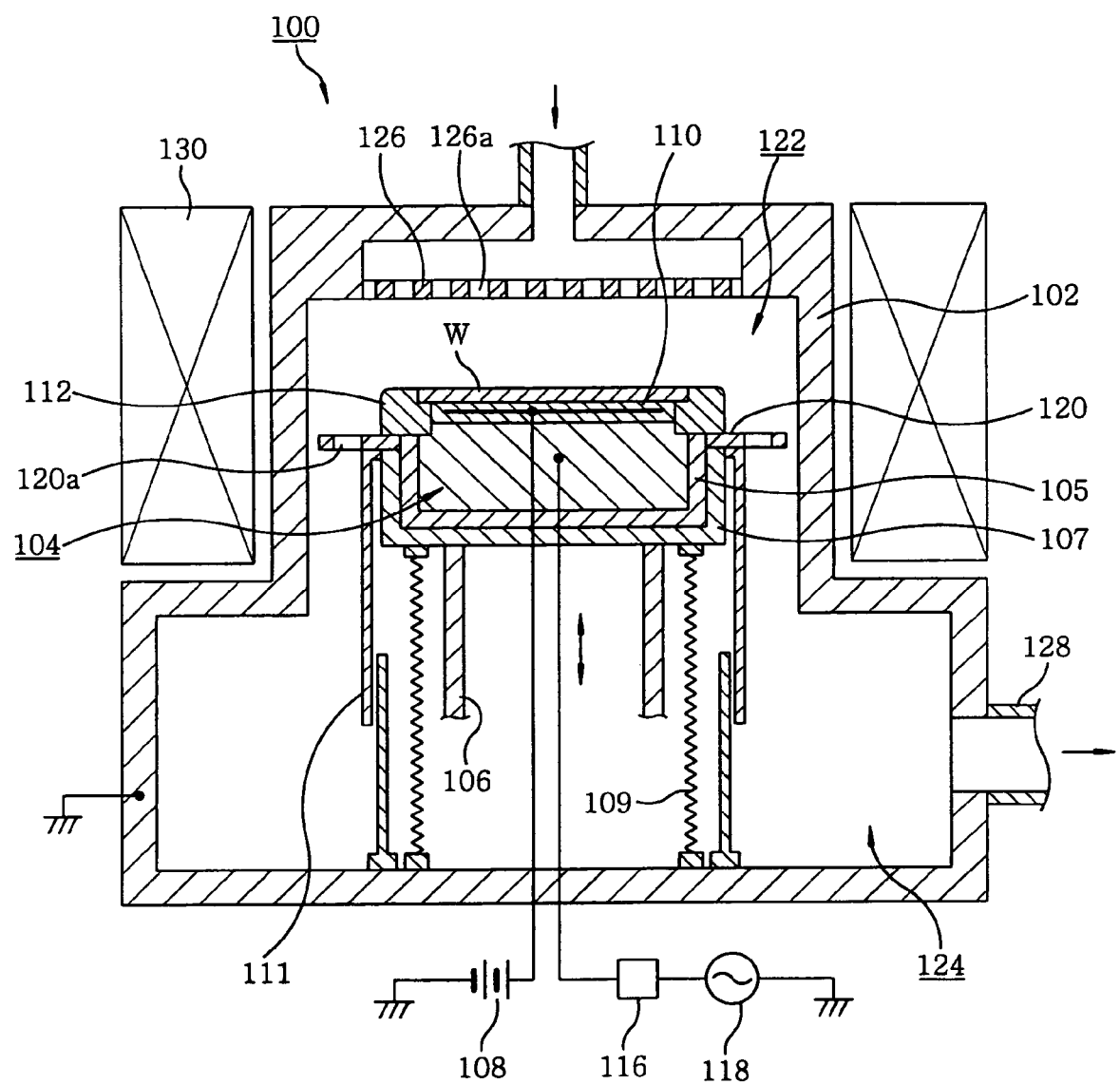
FIG. 1 is a schematic cross sectional view of an etching apparatus for use in performing an etching method in accordance with the present invention.

Preferred embodiment of the present invention will now be described in detail with reference to the accompanying drawings, wherein like parts will be assigned like reference numerals and explanations thereof will not be repeated.

First Preferred Embodiment

Referring to FIG. 1, there is illustrated a schematic cross sectional view of an etching apparatus 100 for use in performing an etching method in accordance with the present invention. The etching apparatus 100 includes a processing vessel 102 for accommodating therein a semiconductor wafer W to be processed having a mask formed on a surface thereof. The processing vessel 102 is grounded and made of aluminum having an aluminum oxide film layer formed on the surface thereof by, e.g., anodic oxidation.

Disposed within the processing vessel 102 is a lower electrode 104 also serving as a susceptor for mounting thereon the wafer W to be processed. The lower electrode 104 is covered with an insulating member 105 made of, e.g., ceramic and a conductive member 107 formed of, e.g., aluminum, except a mounting surface thereof.

The lower electrode 104 is moved up and down by an elevating shaft 106. Further, provided between the conductive member 107 and the processing vessel 102 is a bellows 109 which is made of, e.g., a stainless steel. Further, since the aluminum oxide film layer is removed from surface portions of the conductive member 107 and the processing vessel 102 where they are making an electrical contact with the bellows 9, the conductive member 107 is grounded via the bellows 109 and the processing vessel 102. Further, a bellows cover 111 is disposed to surround a lateral surface of the conductive member 107 and the bellows 109.

Provided on the mounting surface of the lower electrode 104 is an electrostatic chuck 110 which is connected to a high voltage DC power supply 108. And, a focus ring 112 is disposed to surround the electrostatic chuck 110. Connected to the lower electrode via a matching unit 116 is a high frequency power source 118 for supplying a high frequency power.

Provided at a lateral side of the lower electrode 104 is a baffle plate 120 interposed between the focus ring 112 and the conductive member 107, wherein the baffle plate 120 is fixed on a top portion of the conductive member 107 via one or more conductive screws (not shown). The baffle plate 120 is made of a conductive material, e.g., aluminum whose surface is treated by anodic oxidation. However, the aluminum oxide film layer of the baffle plate 120 is partially removed at joint portions where the baffle plate 120 and the conductive member 107 make an electrical contact with each other.

Accordingly, the baffle plate 120 is grounded via the conductive member 107, the bellows 109 and the processing vessel 102 and, thus, the baffle plate 120 and an inner wall of the processing vessel 102 can be set to have a substantially same electric potential (ground potential). As a result, the baffle plate 120 and an upper portion of the inner wall of the processing vessel 102 above the baffle plate 120 can serve as opposing electrodes of the lower electrode 104. By such configuration, a plasma can be confined within a space above the baffle plate 120, i.e., in a processing space 122 to be described later.

The baffle plate 120 is provided with a plurality of slits 120a and serves to divide the interior of the processing vessel 102 into the processing space 122 in which the wafer W is disposed and a gas exhaust path 124 which communicates with a gas exhaust line 128 to be described later.

An upper electrode 126 is installed in the upper interior surface of the processing vessel 102 to face the mounting surface of the lower electrode 104. The upper electrode 126 is provided with a plurality of gas injection openings 126a through which a processing gas is supplied into the processing space 122 from a gas supply source (not shown).

Connected to a lower portion of the processing vessel 102 is the gas exhaust line 128, which in turn is coupled to a vacuum exhaust unit (not shown). The atmosphere within the processing space 112 is evacuated to a predetermined vacuum level via the slits 120a of the baffle plate 120, the gas exhaust path 124 and the gas exhaust line 128. Further, a magnet 130 is disposed to an exterior of the processing vessel 102 to surround a plasma area formed in the processing space 122.

In the following, there will be explained exemplary etching conditions.

A wafer made of silicon (Si) with a diameter of 200 mm is employed as an object to be etched. An $SF_6$ gas or a gaseous mixture of $SF_6$ and $O_2$ can be used as a processing gas. Specifically, a gaseous mixture of the $SF_6$ gas having a flow rate ranging from 200 to 1000 sccm (e.g., 800 sccm) and the $O_2$ gas having a flow rate not greater than 300 sccm (e.g., 150 sccm) can be utilized. An inner pressure of the processing vessel 102 is set to range from 200 mTorr to 400 mTorr. A temperature of the mounting surface of the lower electrode 104 is determined to be between −15.degree. C. to 10.degree. C. inclusive. Further, a high frequency power ranging from 500 W to 2000 W with 40 MHz is applied to the lower electrode 104. The strength of a magnetic field formed by the magnet 130 is set to be 170 gausses.

Figure 2:
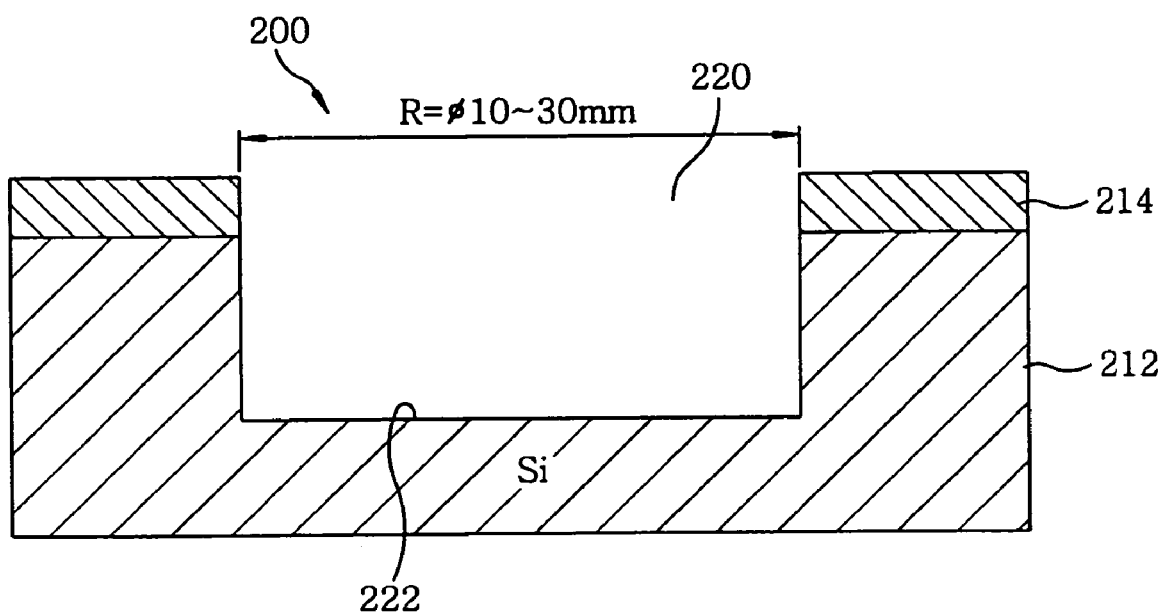
FIG. 2 provides a schematic cross sectional view showing an ideal shape of a recess to be formed on an object to be etched.

Referring to FIG. 2, there is provided a schematic cross sectional view showing an ideal shape of a recess to be formed in an object to be etched. An object 200 to be processed shown in FIG. 2 includes a wafer 212 to be etched which is made of silicon; and a mask 214 formed on the wafer 212. The mask 214 has an opening corresponding to a recess 220 to be formed. By etching the object 200 to be processed through the use of the plasma etching apparatus 100 described in FIG. 1, the recess 220 having a substantially vertical wall and a flat bottom surface 222 is formed on a surface of the wafer 212, as shown in FIG. 2.

Figure 3A:
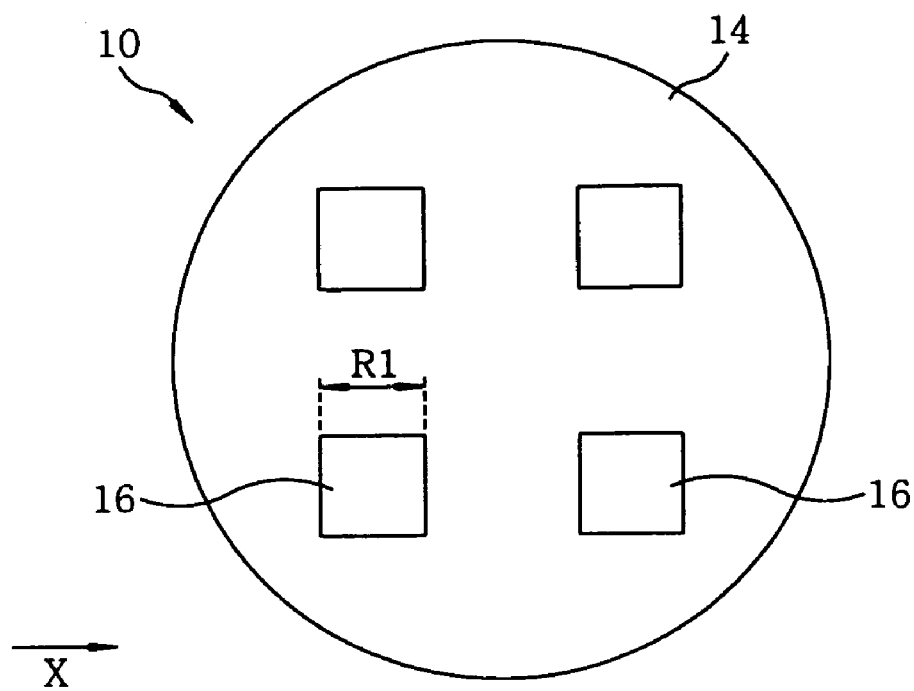
FIGS. 3A and 3B set forth a plane view and a partial cross sectional view of an object to be processed, respectively, for explaining a conventional etching method.
Figure 3B:
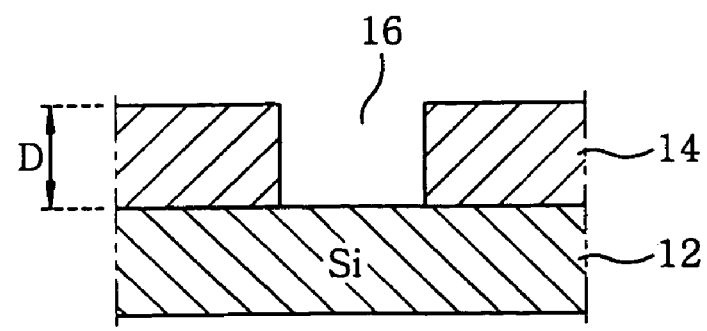

FIGS. 3A and 3B provide a plane view and a partial cross sectional view of an object 10 to be processed, respectively, for describing a conventional etching method. The object 10 to be processed shown in FIGS. 3A and 3B includes a wafer 12 to be etched which is made of silicon; and a mask 14 formed on the wafer 12 as well. The mask 14 has openings 16 corresponding to recesses to be formed. In the conventional etching method, the material for the mask 14 is a tape made of a polyimide based polymer material. Further, the opening of the mask 14 is of a square shape with a side length (opening dimension) R1 of 30 mm, and the thickness D of the mask 14 is 25 .mu.m.

Figure 4:
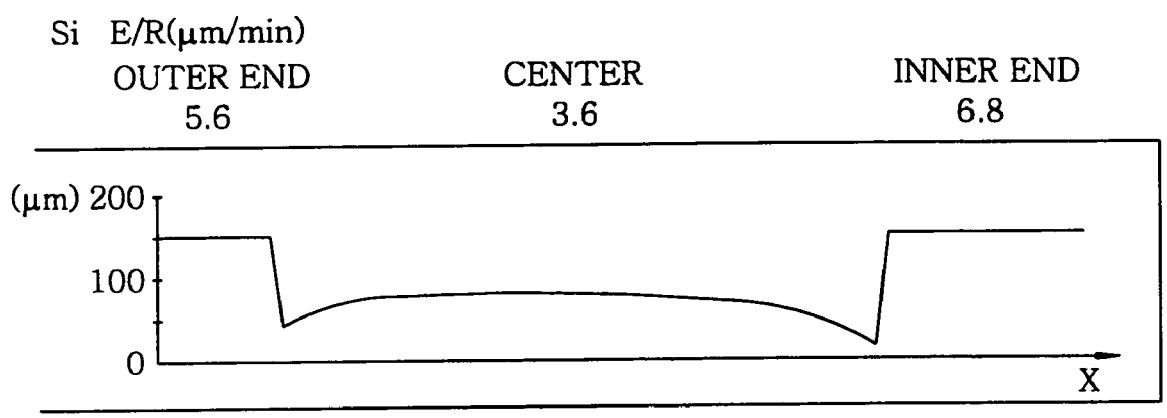
FIG. 4 shows a result of investigating a shape of a recess formed by the conventional etching method by means of a surface profiler.

The object 10 to be processed was plasma-etched under the above-specified processing conditions by using the etching apparatus 100 shown in FIG. 1. FIG. 4 shows a result of investigating a shape of the recess thus formed by using the surface profiler along with an etching rate (E/R) at each portion. In FIG. 4, a horizontal axis corresponds to an X direction of FIG. 3A and measurements were conducted from an outer end of the recess, which was closer to a periphery of the object 10 to be processed, toward an inner end of the recess opposing to the outer end. As can be seen from FIG. 4, the etching rates (.mu.m/min) at the outer end and the inner end were found to be 5.6 and 6.8, respectively, which were far greater than the etching rate of 3.6 at a central portion of the recess. Such a difference in the etching rates results in a subtrench shape.

It is conjectured that such a result is due to the fact that since the recess has an opening whose dimension is beyond the order of millimeter, a plasma existing right above the recess (opening) becomes strongly influenced by the silicon of the object to be etched which is different from material making up the mask, thereby converting it into a state different from that of a plasma formed above the mask. That is, it is considered that a region around the outer end of the recess will experience an etching rate higher than that of the central portion due to the influence from the plasma present above the mask.

Figure 5A:
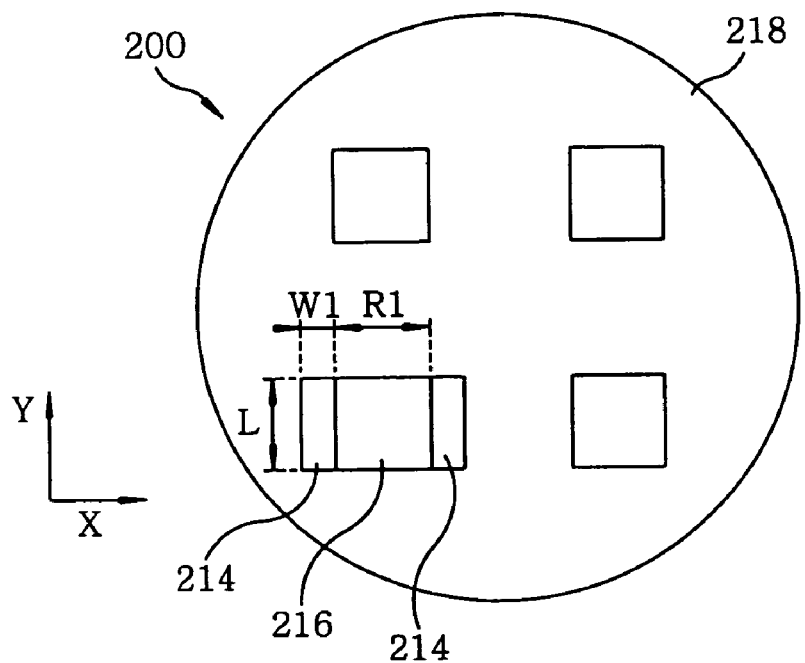
FIGS. 5A and 5B illustrate a plane view and a partial cross sectional view of an object to be processed, respectively, for explaining an etching method in accordance with a first preferred embodiment of the present invention.
Figure 5B:
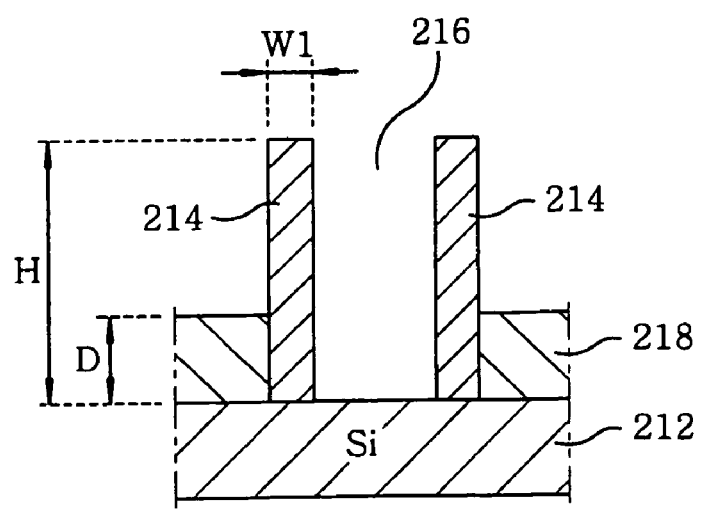

FIGS. 5A and 5B illustrate a plane view and a partial cross sectional view of an object 200 to be processed, respectively, for explaining the etching method in accordance with the present invention.

As can be inferred from the foregoing description, it is preferable that at least a portion around the opening of the mask is made of the same material as that used for forming the wafer in case of forming the recess in the wafer to be etched. By using the same material, it is considered that the plasma formed above the object to be processed can be made uniform.

For a comparison with the conventional etching method, the object 200 to be processed was prepared as shown in FIGS. 5A and 5B. Specifically, the object 200 to be processed included a wafer 212 made of silicon, wherein formed on the wafer 212 as a mask were walls of silicon chips 214 to be outwardly adjacent to two facing X-directional end portions of an opening 216 corresponding to a recess to be formed; and a tape type mask 218 made of a conventional polyimide based polymer material formed in regions on the wafer 212 other than where the silicon chips 214 and the opening 216 were located. Accordingly, only the portions adjacent to the X-directional facing end portions of the opening 216 could be formed of the same material as that of the object 212 to be etched.

Herein, the opening 216 of the mask is of a square shape with a side length R1 of 30 mm, and the thickness D of the mask 218 is 25 .mu.m. Further, the height H of each silicon chip 214 is 725 .mu.m and the width W1 thereof is 10 mm.

Figure 6A:
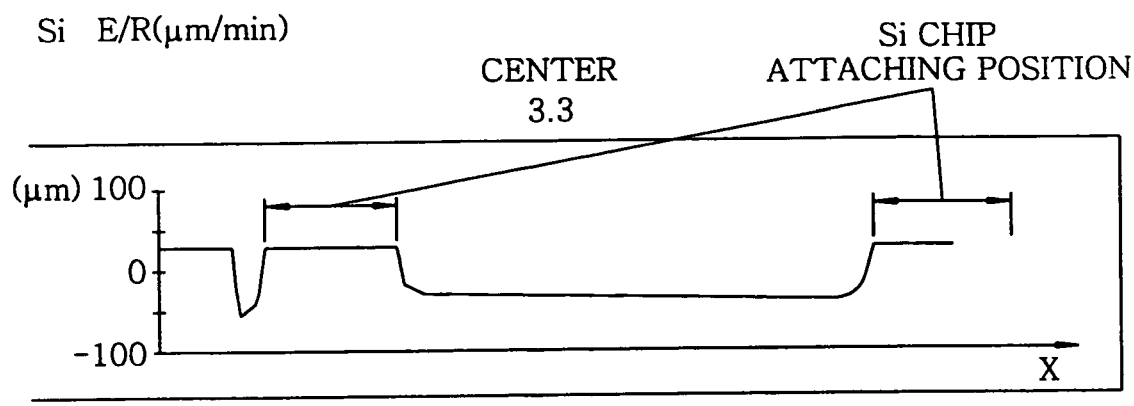
FIGS. 6A and 6B provide results of investigating a shape of a recess formed by the method in accordance with the first embodiment explained by using FIGS. 5A and 5B in an X-direction and a Y-direction respectively by means of the surface profiler.
Figure 6B:
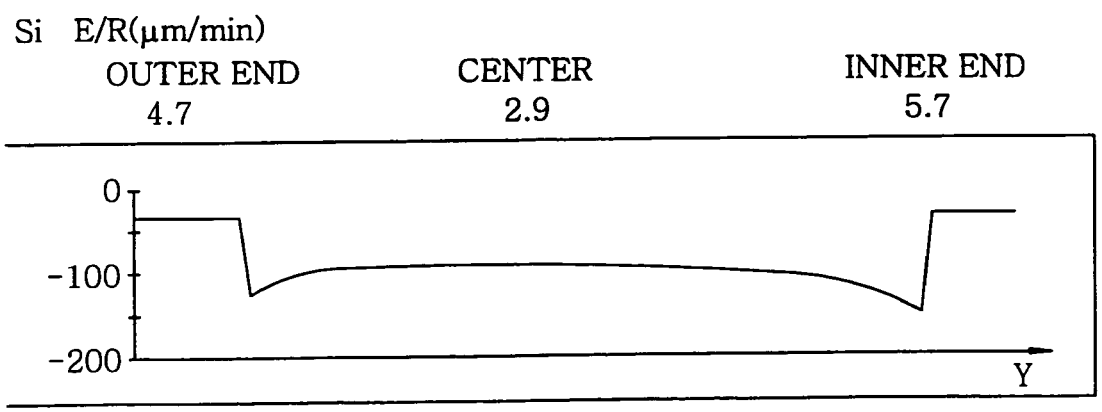

Etching of the object 200 to be processed was conducted under the above-described processing conditions by employing the etching apparatus 100 shown in FIG. 1. FIGS. 6A and 6B show a result of investigation on a shape of the recess thus obtained by using the surface profiler along with an etching rates at each portion. A horizontal axis of FIG. 6A corresponds to an X direction of FIGS. 5A and 5B while a horizontal axis of FIG. 6B corresponds to a Y direction thereof. In both of FIGS. 6A and 6B, measurements were conducted from an outer end of the recess, which was closer to a periphery of the object 200 to be processed, toward an inner end thereof, which was located opposite to the outer end. As can be seen from FIG. 6B corresponding to the conventional etching method (Y direction), the etching rates (.mu.m/min) at the outer end and the inner end were found to be 4.7 and 5.7, respectively, which were clearly greater than the etching rate of 2.9 at a central portion of the recess. Apparently, such a difference in the etching rates must have resulted in the subtrench shape.

Meanwhile, in FIG. 6A corresponding to the etching method of the present invention (X direction), there was observed no subtrench shape and, further, the etching rate (.mu.m/min) at a central portion of the recess was found to be 3.3, not making any noticeable difference from that in FIG. 6B. The achievement is considered possible because the state of the plasma above the recess (opening portion) can be uniformly maintained, even in case the recess has a large opening dimension, by forming at least the portion around the opening of the mask with the same material as used for forming the object to be etched.

As described above, by forming at least the portion around the opening of the mask with the same material as used for the formation of the object to be etched, generation of a subtrench shape can be prevented from being developed even in case of forming, e.g., a recess of a rectangular column with an opening dimension of 30 mm, so that the recess with a substantially flat bottom surface can be obtained. Thus, it becomes possible to form the recess with the opening size of the order of millimeters without a subtrench shape formed at the bottom surface thereof.

Furthermore, if a portion of the object to be etched where the recess is to be formed is made of a material different from that forming the other portions of the object, it is preferable to form at least the portion around the opening of the mask by using the same material as used for forming the portion where the recess is to be formed.

Second Preferred Embodiment

An etching method in accordance with a second preferred embodiment of the present invention can be performed by using the etching apparatus 100 (shown in FIG. 1) as described in the first embodiment. Thus, explanation thereof will be omitted herein.

Figure 7A:
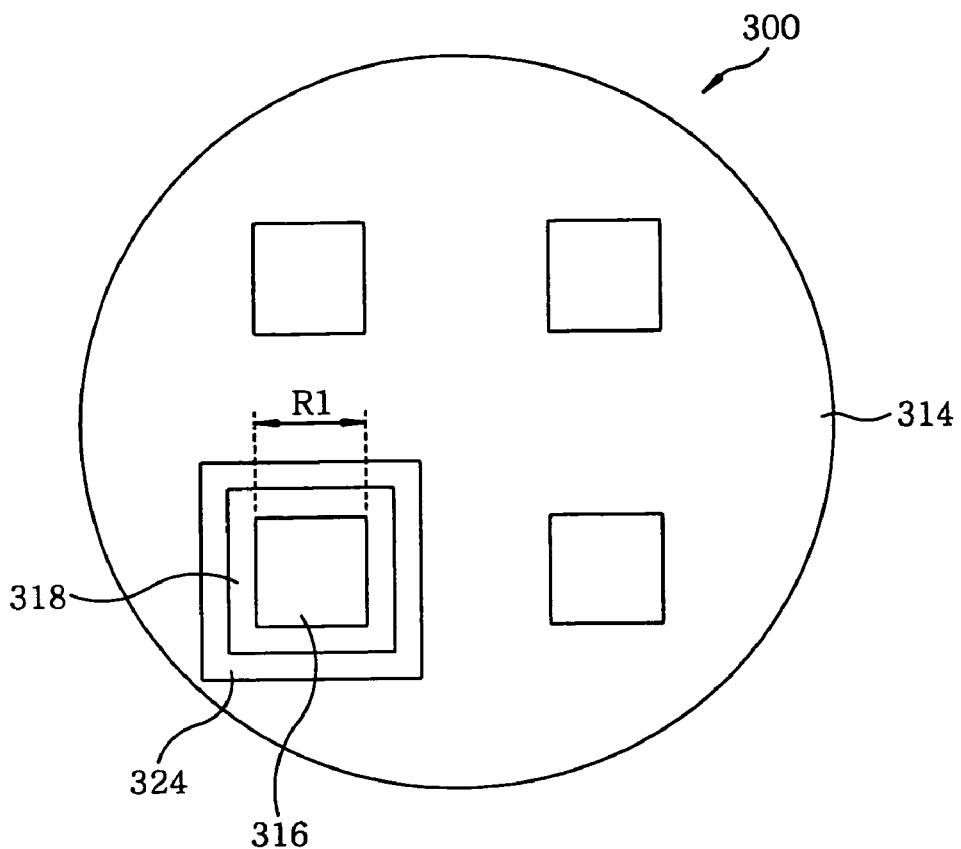
FIGS. 7A and 7B offer a plane view and a cross sectional view of an object to be processed, respectively, for explaining an etching method in accordance with a second preferred embodiment of the present invention.
Figure 7B:
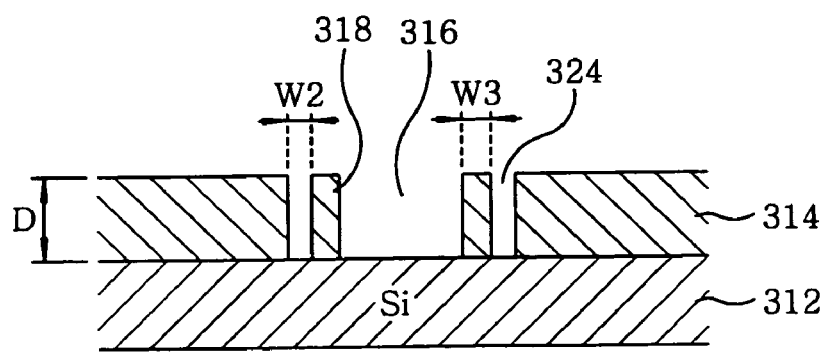
Figure 8:
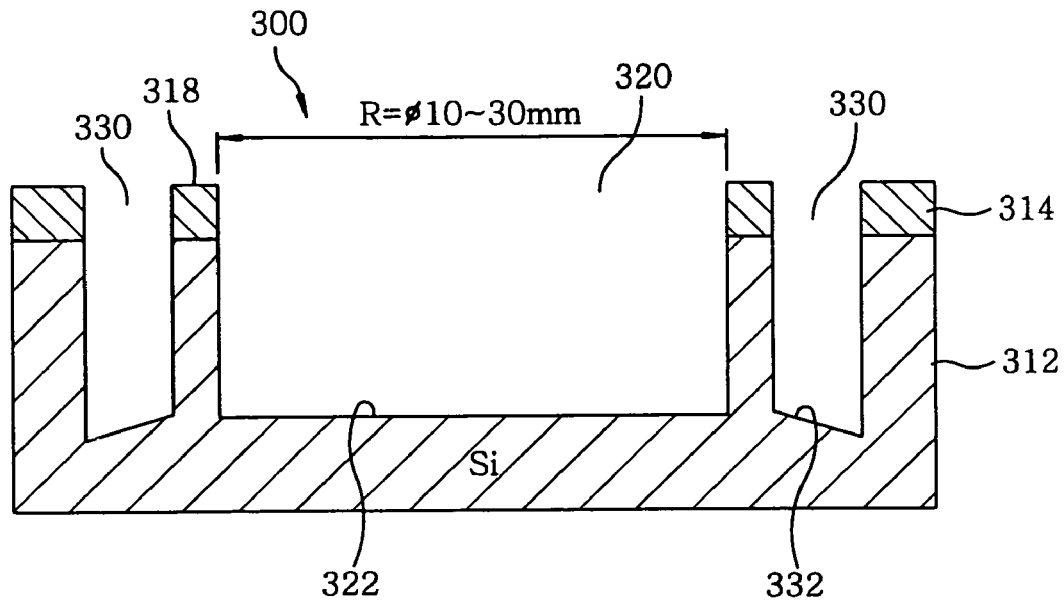
FIG. 8 is a schematic cross sectional view of an object to be processed etched by the method in accordance with the second embodiment described in FIG. 7.
Figure 9:
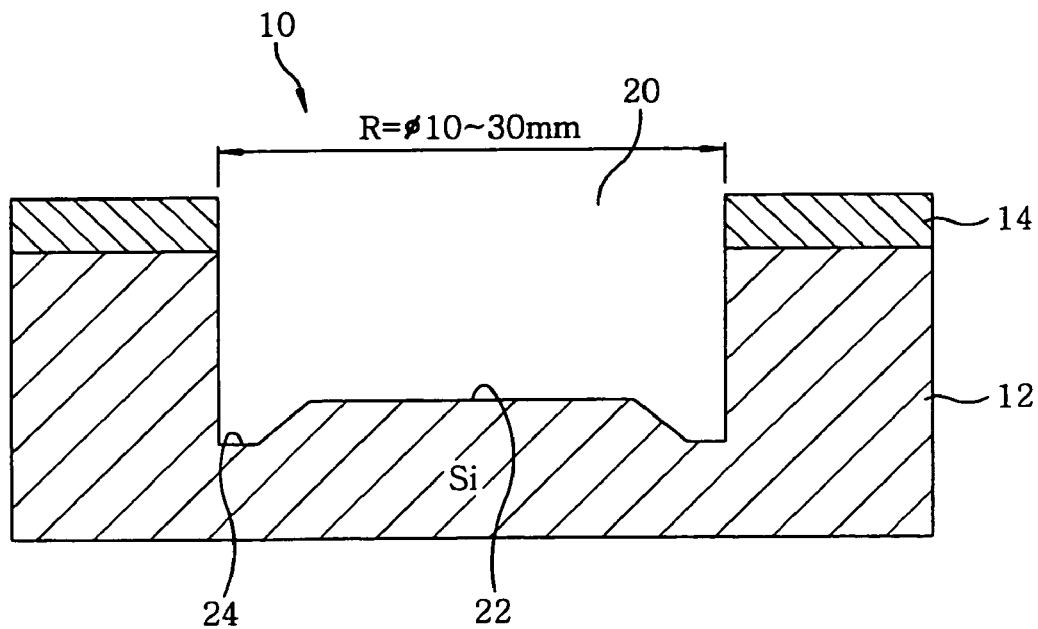
FIG. 9 depicts a schematic cross sectional view of an object to be processed by the conventional method.

Referring to FIGS. 7A and 7B, there are provided a plane view and a cross sectional view of an object 300 to be processed, respectively, for describing the etching method in accordance with the second embodiment. Further, FIG. 8 shows a schematic cross sectional view of the object 300 etched in accordance with the second embodiment.

The object 300 to be processed includes a wafer 312 to be etched which is made of silicon and a mask 314 which is formed on the wafer 312. The material for the mask 314 is a tape made of a polyimide based polymer material. The mask 314 has a main opening 316 corresponding to a recess to be formed and a slit-shaped subsidiary opening 324 closely surrounding the main opening 316. Thus, a dummy recess corresponding to the subsidiary opening 324 is formed on a surface of the wafer 312 through the etching of the object 300 to be processed, the dummy recess being disposed around the recess corresponding to the main opening 316.

Herein, the main opening 316 of the mask 314 is of a square shape with a side length R1 of 30 mm, and the thickness D of the mask 14 is 25 .mu.m. Further, the slit width W2 of the subsidiary opening 324 is 5 mm and a width W3 of a mask portion 318 between the openings 316 and 324 is 100 .mu.m.

Plasma etching of the object 300 to be processed is conducted under the above-described processing conditions by employing the etching apparatus 100 shown in FIG. 1. As a result, the dummy recess corresponding to the subsidiary opening 324 will have a slant bottom surface 332 tilted down toward an outer peripheral side thereof, as shown in FIG. 8, which looks similar to the subtrench shape. The formation of the slant bottom surface 332 of such a shape is conjectured as a result of an increase of an etching rate at the outer peripheral side of the recess 330 due to the influence of the material of the mask 314 on the plasma.

In contrast, no subtrench shape is formed on a bottom surface 322 of a recess 320 corresponding to the main opening 316, and its bottom surface 322 is maintained flat. It seems that if the width of the mask portion 318 is very narrow, the influence of the mask material on the plasma above the recess 320 can be minimized. That is, it is likely that plasma affected by the silicon of the wafer 312 exposed through the subsidiary opening 324 is formed above the opening edge portion of the recess 320, so that the plasma present above the recess 320 can be made uniform.

By using the mask 314 having the main opening 316 and the subsidiary opening 324 described, formation of a subtrench shape can be prevented from being developed even in case of forming, e.g., the recess 320 of the rectangular column shape with the opening dimension of 30 mm, thereby obtaining a recess having the flat bottom surface. Accordingly, it becomes possible to fabricate a recess with an opening dimension of the order of millimeter without forming a subtrench shape on the bottom thereof.

Third Preferred Embodiment

Since an etching method in accordance with a third preferred embodiment of the present invention can be performed by using the etching apparatus 100 provided with the processing vessel 102 (shown in FIG. 1) as described in the first embodiment, explanation thereof will be omitted herein.

In the third embodiment, the inner pressure of the processing vessel 102 is set to be lower than that in conventional cases during etching. That is, though the inner pressure of the processing vessel 102 is set to range from 200 to 400 mTorr in the first and the second embodiment, the inner pressure in the third embodiment is determined to be not greater than 100 mTorr, e.g., 36 mTorr. The other processing conditions are identical to those in the first and the second embodiment.

Further, a mask made of, e.g., a general resin as in the case of the conventional object 100 to be processed shown in FIG. 3 can be used for an object to be processed for use in the third embodiment. In accordance with this embodiment, a recess having a substantially vertical sidewall and a flat bottom surface, which is similar to the recess 220 shown in FIG. 2, can be formed even though the conventional object to be processed is etched.

If plasma etching is carried out under the pressure lower than in the conventional cases as in the third embodiment, a plasma density within the processing space 122 (FIG. 1) is reduced. Though an overall etching rate is lowered in such a case when compared with a case featuring a high plasma density, it is unlikely that there occurs a difference in etching rates due to the influence of materials forming the surface of the object to be processed. It is conjectured that the decrease in the plasma density in turn reduces influences of the materials of the surface of the object to be processed on the status of the plasma existing thereabove.

Thus, it becomes possible to form a recess with an opening dimension of the order of millimeter without a subtrench shape formed on a bottom surface thereof. Furthermore, since the third embodiment can be carried out by using a mask having a conventional shape or made of a conventional material, the mask formation can be achieved by employing the same technique as adopted in the conventional cases.

Further, the present invention is not limited to the preferred embodiment described. While the invention has been shown and described with reference to the preferred embodiments, it will be understood by those skilled in the art that various changes and modifications may be made without departing from the spirit and scope of the invention as defined in the following claims.

For example, though the present invention has been described for the case of forming the recess of the quadrangular pyramid shape with the opening dimension of 30 mm in the preferred embodiments, the shape and the dimension of the recess to be formed is not limited thereto. That is, the present invention can be applied to etching of a groove or a recess with a cross section of various shapes, e.g., a circular shape, an elliptic shape, a rectangular shape, a groove shape, etc., as long as the recess has an opening dimension of the order of millimeter (for example, not smaller than 5 mm). Moreover, the material for the object to be processed is not limited to silicon. That is, the present invention can also be applied to etching of an object to be processed at least partially substituted with a material other than silicon.

What is claimed is:

1. An etching method for forming a recess on a surface of an object to be etched, comprising:
 a step of forming the recess by plasma etching through an opening of a mask formed on the surface of the object to be etched, wherein the opening is surrounded by a sidewall portion of the mask, and at least a portion of the object to be etched where the recess is to be formed and the sidewall portion essentially consist of silicon, and wherein a portion of the mask surrounding the sidewall portion is made of a material other than silicon.

2. The etching method of claim 1, wherein the opening of the mask has an opening dimension not smaller than 5 mm.

3. An etching method for forming a recess on a surface of an object to be etched, comprising:
 a step of forming the recess by plasma etching through an opening of a mask formed on the surface of the object to be etched, the opening having an opening dimension not smaller than 5 mm and being surrounded by a sidewall portion of the mask, wherein at least a portion of the object to be etched where the recess is to be formed and the sidewall portion are made of a same material, which is different from a material constituting a portion of the mask surrounding the sidewall portion.

4. The etching method of claim 3, wherein the plasma etching is performed in a processing vessel at a pressure not greater than 100 mTorr.

5. An etching method for forming a recess on a surface of an object to be etched, comprising:
forming the recess by plasma etching through an opening formed through a mask, wherein the mask includes a first mask portion serving as at least a part of a sidewall of the opening and a second mask portion surrounding the sidewall of the opening, and wherein a portion of the object where the recess is to be formed and the first mask portion essentially consist of a same material which is different from a material constituting the second mask portion.

6. The etching method of claim 3, wherein the same material is silicon.

7. The etching method of claim 5, wherein the same material is silicon.

8. The etching method of claim 5, wherein the opening has an opening dimension not smaller than 5 mm.

9. The etching method of claim 1, wherein the plasma etching is performed in a processing vessel at a pressure not greater than 100 mTorr.

10. The etching method of claim 5, wherein the plasma etching is performed in a processing vessel at a pressure not greater than 100 mTorr.

11. The etching method of claim 1, wherein the mask is formed of a polyimide based polymer.

12. The etching method of claim 3, wherein the mask is formed of a polyimide based polymer.

13. The etching method of claim 5, wherein the second mask portion is formed of a polyimide based polymer.

14. The etching method of claim 1, wherein the thickness of the sidewall portion is thicker than that of the mask.

15. The etching method of claim 3, wherein the thickness of the sidewall portion is thicker than that of the mask.

16. The etching method of claim 5, wherein the thickness of the first mask portion is thicker than that of the second mask portion.

17. The etching method of claim 1, wherein the sidewall portion is formed directly on the surface of the object.

18. The etching method of claim 3, wherein the sidewall portion is formed directly on the surface of the object.

19. The etching method of claim 5, wherein the first mask portion is formed directly on the surface of the object.

20. The etching method of claim 5, wherein the second mask portion does not include silicon.

* * * * *